United States Patent [19]

Hong et al.

[11] Patent Number: 6,048,784

[45] Date of Patent: Apr. 11, 2000

[54] TRANSISTOR HAVING AN IMPROVED SALICIDED GATE AND METHOD OF CONSTRUCTION

[75] Inventors: Qi-Zhong Hong, Dallas; Jorge A. Kittl, Plano, both of Tex.

[73] Assignee: Texas Instruments Incorporated, Dallas, Tex.

[21] Appl. No.: 09/212,189

[22] Filed: Dec. 15, 1998

Related U.S. Application Data

[60] Provisional application No. 60/069,986, Dec. 17, 1997.

[51] Int. Cl.$^7$ ............... H01L 21/3205; H01L 21/336; H01L 21/477
[52] U.S. Cl. ............... 438/592; 438/302; 438/303; 438/308; 438/798; 438/800; 257/309; 257/401; 257/388
[58] Field of Search ................... 438/592, 302, 438/303, 308, 798, 800; 257/388, 309, 401, 617

[56] References Cited

U.S. PATENT DOCUMENTS

| | | | |
|---|---|---|---|
| 5,366,915 | 11/1994 | Kodama | 438/257 |
| 5,656,519 | 8/1997 | Mogami | 438/303 |
| 5,691,212 | 1/1998 | Tsai et al. | 438/297 |
| 5,712,196 | 1/1998 | Ibok | 438/592 |
| 5,858,849 | 1/1999 | Chen | 438/305 |
| 5,877,074 | 3/1999 | Jeng et al. | 438/592 |
| 5,879,975 | 3/1999 | Karlsson et al. | 438/162 |
| 5,937,325 | 8/1999 | Ishida | 438/655 |
| 5,970,353 | 10/1999 | Sultan | 438/302 |
| 5,981,367 | 11/1999 | Gonzalez | 438/593 |
| 5,985,712 | 11/1999 | Ooishi | 438/231 |

*Primary Examiner*—Tom Thomas
*Assistant Examiner*—Bernard E. Snow
*Attorney, Agent, or Firm*—Jacqueline J. Garner; Wade James Brady; Richard L. Donaldson

[57] ABSTRACT

A method of fabricating a transistor having an improved salicided gate is provided. The method may include forming a gate (14) that is separated from a substrate (12) by a gate insulator (16). A spacer (22) may be formed proximate the gate (14) such that the spacer (22) exposes a top region (28) and a side region (30) of the gate (14). The top region (28) and the side region (30) of the gate (14) may be irradiated at an angle (38) to form a post amorphous region (32) within the gate (14). A reactive layer (42) may be formed adjacent the post amorphous region (32). A salicidation region (44) may be then formed between the post amorphous region (32) and the reactive layer (42). The reactive layer (42) may be removed to expose the salicidation region (44).

20 Claims, 3 Drawing Sheets

TRANSISTOR HAVING AN IMPROVED SALICIDED GATE AND METHOD OF CONSTRUCTION

This application claims priority under 35 USC § 119 (e) (1) of provisional application No. 60/069,986, filed Dec. 17, 1997.

TECHNICAL FIELD OF THE INVENTION

This invention relates generally to the field of electronic devices, and more particularly to a transistor having an improved salicided gate and method of construction.

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductive, semiconductive, and insulator regions formed on the semiconductor substrate.

The density of the microelectronic devices on the semiconductor substrate may be increased by decreasing the size, or linewidth, of the various semiconductor devices. The decrease in linewidth allows a larger number of such microelectronic devices to be formed on the semiconductor substrate. As a result, the computing power and speed of the semiconductor component may be greatly improved.

In order to decrease the linewidth of the microelectronic device, the size and thickness of the conductor, semiconductor, and insulator regions forming each microelectronic device must be reduced. As the size of the microelectronic device is scaled down to sub-micron sizes, salicidation of the contact surfaces between conductive regions becomes increasingly difficult. Salicidation is the process of forming a self-aligned region comprising a conductive silicide material. This region is useful, for example, in reducing the electrical contact resistance between conductive contacts. One form of salicidation uses titanium silicide. The sheet resistance of titanium silicide increases as the linewidth decreases. Salicidation of a gate of a transistor is an area in which the increased sheet resistance is particularly problematic.

Some methods of salicidation amorphize the outer surface of the layer forming the gate conductor in order to reduce the sheet resistance of the titanium silicide. However, these amorphization methods can damage the source and drain components of the transistor. The damage to the transistor may result in an increase of the series resistance and a decrease of the device drive current, thereby decreasing the performance of the transistor.

SUMMARY OF THE INVENTION

Accordingly, a need has arisen for a transistor having an improved salicided gate. The present invention provides a transistor having an improved salicided gate that substantially eliminates or reduces problems associated with the prior methods and systems.

In accordance with one embodiment of the present invention, a method of fabricating a silicidation region in a gate of a transistor is provided. The method comprises forming a gate that is separated from a substrate by a gate insulator. A spacer is formed proximate the gate such that the spacer exposes a top region and a side region of the gate. The top region and the side region of the gate are irradiated with an ion beam that impinges the gate surfaces at an angle to form a post amorphous region. The angle is formed between the ion beam and an axis perpendicular to a surface of the substrate, and is between about 5° and 80°. A reactive layer is then formed adjacent to the post amorphous region. The reactive layer is heated and reacts with the material forming the gate to form a salicidation region between the post amorphous region and the reactive layer. The reactive layer is then removed to expose the salicidation region.

Important technical advantages of the present invention include providing a transistor having a source and drain that are not substantially damaged during the irradiation process. The angled irradiation process reduces the ion implantation damage that occurs during some implantation processes. The reduced damage in the source and drain reduces the series resistance and an increase of the device drive current.

Another important technical advantage of the present invention includes providing a transistor gate with an increased salicidation region. Specifically, the gate includes a thick amorphous region proximate the side region of the gate that is formed by the angled irradiation. The thick amorphous region of the gate enhances the formation of titanium silicide. Accordingly, the conductance of the gate contact is increased and the sheet resistance is decreased.

Yet another technical advantage of the present invention includes providing a transistor with a gate having a reduced sheet resistance. Accordingly, the space between electrical devices may be decreased. Thus, the present invention may allow the fabrication of gates for transistors that are smaller than the gates fabricated by conventional techniques.

Other technical advantages will be readily apparent to one skilled in the art from the following figures, description, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

FIGS. 1A through 1H illustrate a method of fabricating a transistor having an improved salicided gate. As described in more detail below, the salicided gate may be fabricated by irradiating the gate at an angle to produce an amorphization region. The angled irradiation reduces the ion implantation damage to the gap region that is used to form a source and drain for the transistor. In addition, the amorphization region in the gate may be larger and provide an increased area for the formation of a silicide layer.

Figure 1A:
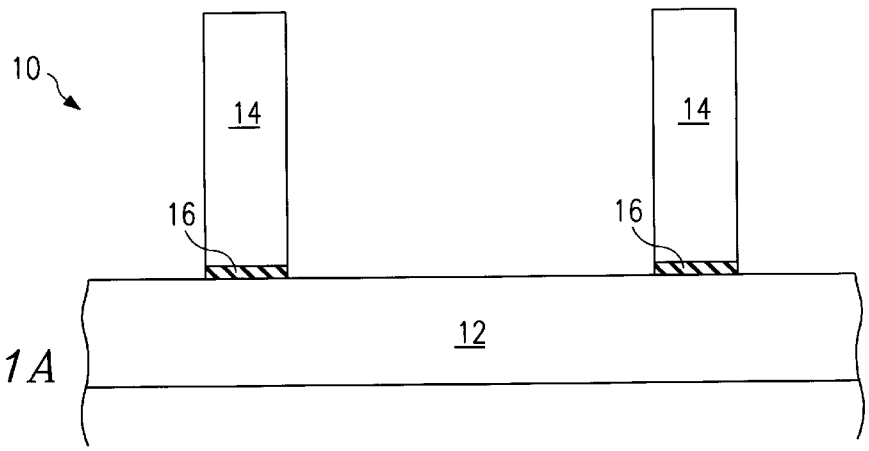
FIGS. 1A through 1H are a series of schematic cross-sectional diagrams illustrating the fabrication of a transistor having an improved salicided gate in accordance with the present invention.

FIG. 1A illustrates an initial semiconductor structure having a substrate 12. In one embodiment, the substrate 12 comprises a wafer formed from a single-crystalline silicon material. It will be understood that the substrate 12 may comprise other suitable materials or layers without departing from the scope of the present invention. For example, the substrate 12 may include an epitaxial layer, a recrystallized semiconductor material, a polycrystalline semiconductor material, or any other suitable semiconductor material.

Referring again to FIG. 1A, a gate 14 is separated from the substrate 12 by a gate insulator 16. As discussed in greater detail below, the gate 14 and the gate insulator 16 are formed by conventional semiconductor fabrication techniques. The thickness of the gate insulator 16 is on the order of 10 Å to 200 Å. In one embodiment, the gate insulator 16 comprises silicon dioxide. In another embodiment, the gate insulator 16 comprises silicon nitride. It will be understood that the gate insulator 16 may comprise other materials suitable for insulating semiconductor elements.

The gate 14 is generally on the order of 100–500 nanometers in thickness and 20 to 1,000 nanometers in width. The gate 14 generally comprises a polycrystalline silicon material (polysilicon) that is doped with impurities to render the gate 14 conductive.

The gate 14 and gate insulator 16 may be fabricated by growing a primary insulation layer (not shown) covering the substrate 12. A gate layer (not shown) is then deposited over the primary insulation layer. A photoresist layer (not shown) that is sensitive to light is deposited over the gate layer. The photoresist layer is exposed to a pattern of light that cures and hardens that portion of the photoresist layer exposed to the light. The non-cured portion of the photoresist layer is removed to expose the gate layer. The structure is then anisotropically etched to both remove the exposed portion of the gate layer and the primary insulation layer. Anisotropic etching may be accomplished with a plasma-based Reactive Ion Etch (RIE) using carbon fluorine-based gases such as $CF_4$ and or $CHF_3$. The removal of the exposed portions of the gate layer and the exposed portions of the primary gate insulation layer result in the formation of the gate 15, and the gate insulator 16.

Figure 1B:
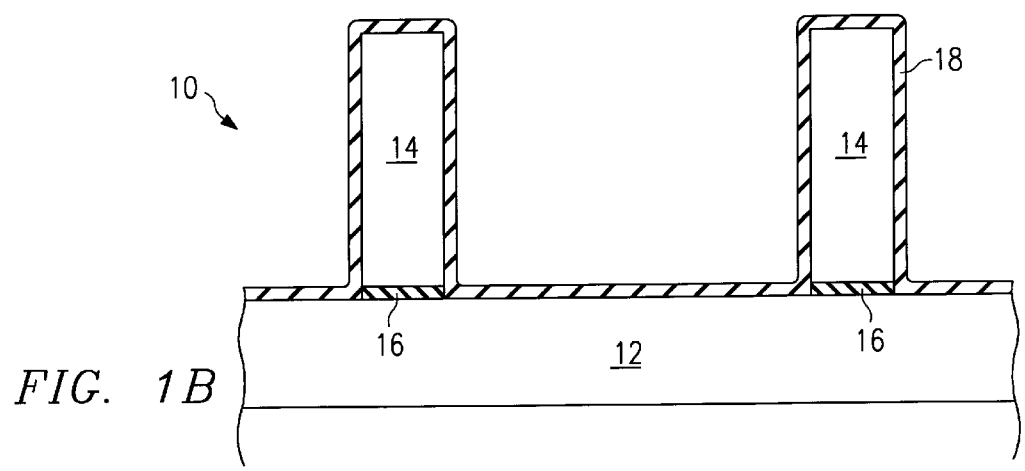

Referring to FIG. 1B, a buffer layer 18 is formed covering the substrate 12 and the gate 14. The buffer layer 18 is generally on the order of 100 Å in thickness. In one embodiment, the buffer layer 18 comprises silicon dioxide. It will be understood that the buffer layer 18 may comprise other suitable materials without departing from the scope of the present invention. For example, the buffer layer 18 may alternatively comprise silicon nitride or other suitable materials.

Figure 1C:
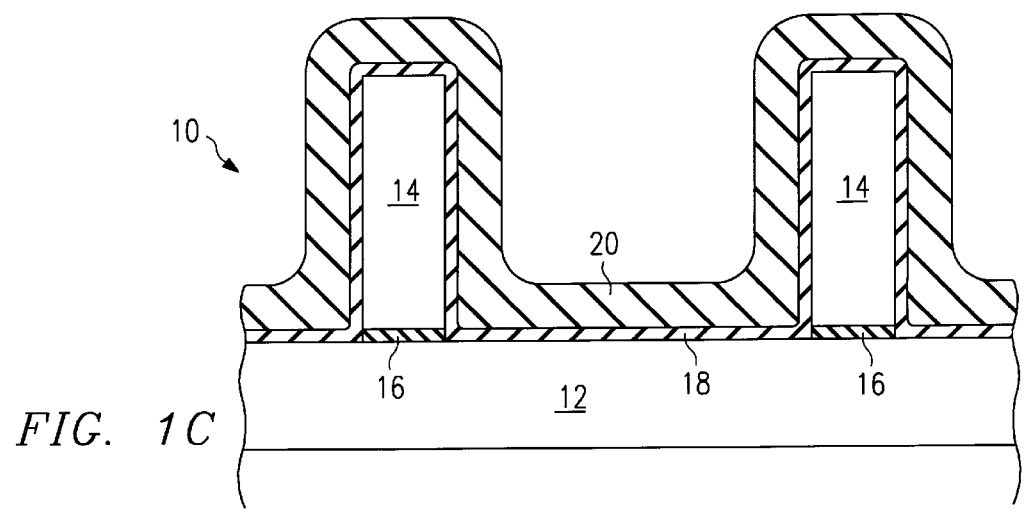

Referring to FIG. 1C, a spacer layer 20 is formed outwardly from the buffer layer 18. The spacer layer 20 is deposited using conventional fabrication techniques, such as Chemical Vapor Deposition (CVD), Physical Vapor Deposition (PVD), or other such suitable fabrication technique. The thickness of the spacer layer 20 is generally on the order of 500 Å. In one embodiment, the spacer layer 20 comprises silicon nitride. It will be understood that the spacer layer 20 may comprise other suitable dielectric materials or layers without departing from the scope of the present invention. For example, the spacer layer 20 may comprise a dielectric such as silicon dioxide, or any other suitable material.

Figure 1D:
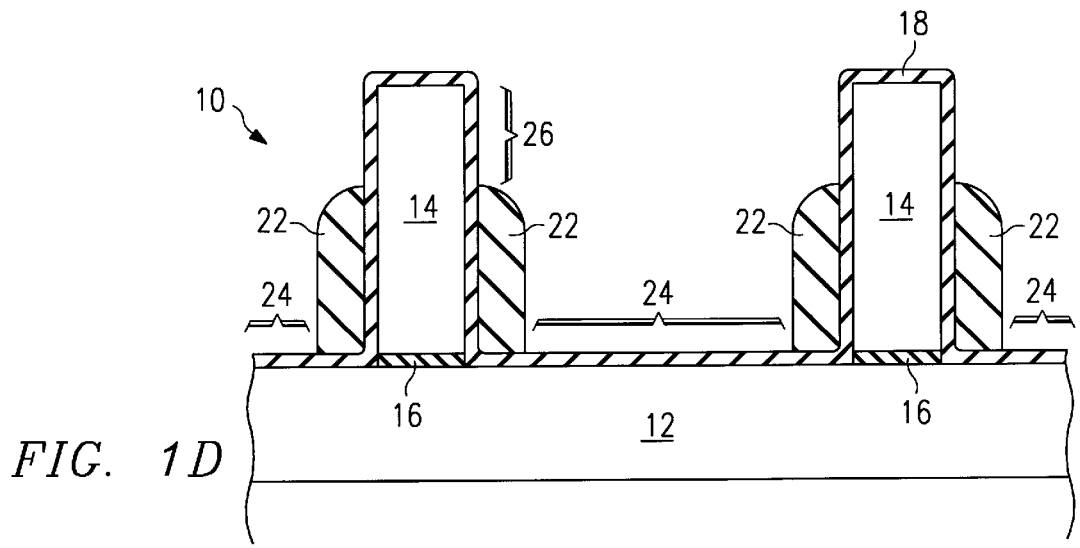

Referring to FIG. 1D, the spacer layer 20 is then anisotropically etched to form a spacer 22 adjacent a portion of the gate 14. As discussed previously, anisotropic etching may be accomplished using a plasma based reactive ion etch process. The region of the substrate 12 between the spacer 22 of each gate 14 forms a gap region 24. The spacer 22 operates to electrically isolate the gate from other elements of the transistor and may provide the spacing for forming self-aligned source and drain regions of the transistor. In one embodiment, the spacer 22 is formed such that a post region 26 of the gate 14 is exposed. The post region 26 includes a top region 28 and a side region 30. The side region 30 is generally exposed by anisotropically etching the spacer layer 20 beyond the top region 28 of the gate 14. In a particular embodiment, the side region 30 is approximately one-half of the width of the gate 14. It will be understood that the side region 30 may be otherwise sized without departing from the scope of the present invention.

Figure 1E:
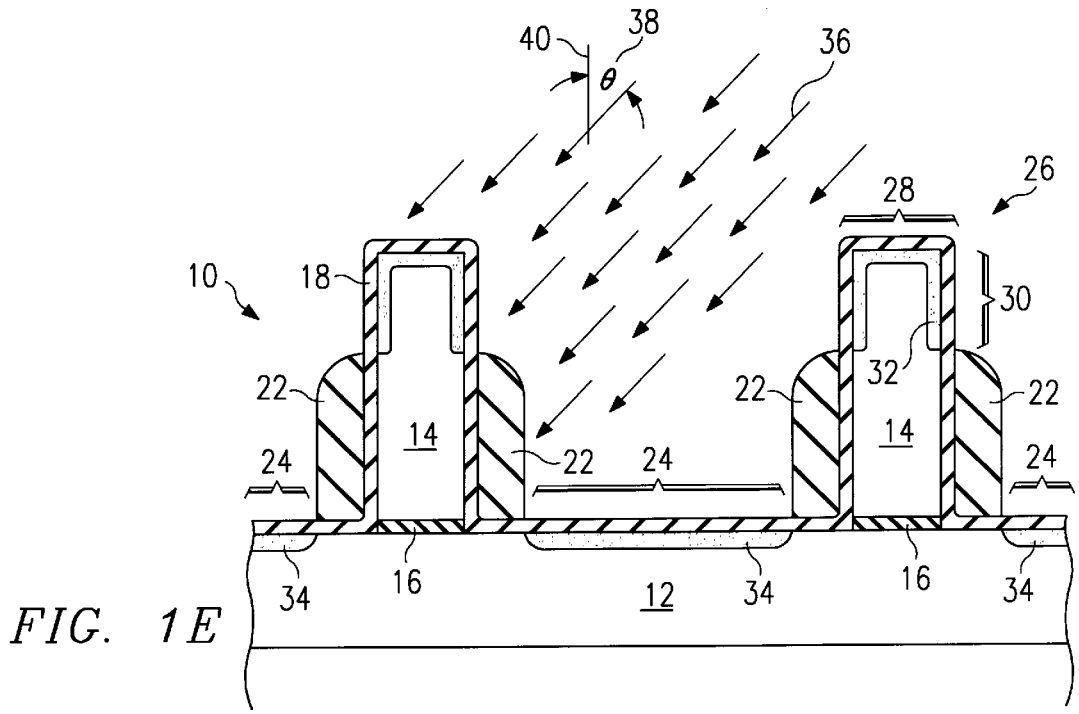

Referring to FIG. 1E, a post amorphous region 32 and a gap amorphous region 34 are formed during an ion bombardment process using an ion beam 36 that impinges the substrate 12 and the gate 14 at an angle 38 from an axis 40 normal to a surface of the substrate 12. As will be discussed in greater detail below, the bombardment process operates by the ion beam 36 impinging particles into a substance to change the material and electrical properties of the substance. As illustrated in FIG. 1E, the post amorphous region 32 is formed within the gate 14 in the post region 26. The gap amorphous region 34 is formed within the substrate 12 in the gap region 24.

The ion beam 36 operates to break apart the polycrystalline grain structure or the material forming the gate 14 and the crystalline structure of the substrate 12 to form the respective amorphous regions 32 and 34. Amorphous materials provide a higher driving force than polycrystalline or single crystalline materials in the formation of silicide.

The thickness of the silicide formed by later fabrication processes is directly related to the thickness of the amorphous regions 32 and 34. This is important because the greater the volume of silicide, the greater the conductance and the lower the sheet resistance of the silicide. Thus, the thickness of the amorphous regions 32 and 34 should be maximized in order to increase conductivity and reduce the sheet resistance of the silicide. However, the formation of the gap amorphous region 34 may be detrimental to the operation of the transistor.

In general, the gap region 24 of the substrate 12 will typically have impurities introduced into the substrate 12 to form doped regions (not shown) in the substrate 12, such as a source and drain region. The formation of the gap amorphous region 34 by the ion beam 36 causes damage in the doped regions of the substrate 12 such that the transistor may have an increased series resistance and a decreased drive current. In addition, the size of the source and the drain regions of the transistor are directly related to the thickness of the gap amorphous region 34. As the size of the transistor is reduced, the size of the source and the drain regions must be similarly reduced, thereby requiring the thickness of the gap amorphous region 34 to be reduced.

The thickness of the amorphous regions 32 and 34 are directly related to the angle 38 in which the ion beam 36 is angled from the axis 40 that is normal to the substrate 12. The greater the angle 38, the lower the intensity with which the ion beam 36 impinges the horizontal surfaces of the substrate 12 and the gate 14. Thus, the greater the angle 38, the lower the vertical ion intensity of the ion beam 36 and the thinner the gap amorphous region 34 and the top region 28 of post amorphous region 32. Accordingly, the damage from the ion beam 36 to the gap region 24 of the substrate 12 is reduced and the gap amorphous region 34 is reduced in thickness by such angle.

In addition, the greater the angle 38, the greater the intensity with which the ion beam 36 impinges the vertical surfaces of the gate 14. Thus, the greater the angle 38, the greater the horizontal ion intensity of the ion beam 36 and the thicker the post amorphous region 32 on the side region 30 of the gate 14. Accordingly, the formation of the post amorphous region 32 having the side region 30 component increases the beneficial surface area and depth of the post amorphous region 32 available for salicidation. Furthermore, the formation of the low sheet resistance post amorphous region 32 in the gate 14 allows the linewidth between microelectronic devices to be decreased.

The possible acuity of the angle 38 is dependent upon the spacing between the gate 14 of each electrical device and the thickness of the gate 14. The spacing and thickness of the gate 14 are important to determine the degree of shading that the gate 14 provides the substrate 12 from the angled ion beam 36. In other words, the gate 14 blocks a portion of the ion beam 36 from striking the substrate 12, thereby forming a shadow on the substrate 12. The angle 38 is a balance of competing factors, the angle 38 must be sufficiently large that the damage to the source and drain elements of the transistor is reduced without being so large that the thickness and spacing of each gate 14 unacceptably shades the substrate 12. The angle 38 is generally between 5° and 80°. In an embodiment in which the gap region 24 is approximately the same as the thickness of the gate 14, the angle 38 is less than 45°. It will be understood that the angle 38 may be varied without departing from the scope of the present invention. In addition, the substrate 12 may rotate about the axis 40 during the ion implantation process to minimize asymmetry caused by the angled implantation process.

The ion beam 36 is typically characterized by the energy, dose, and ion species used in the ion beam 36. In accordance with conventional ion implantation techniques, the energy and dose is dependant upon the ion species and the depth that the ion species is to be implanted. In one embodiment, the ion beam 36 will have an energy of 40 KeV, a dose of $2E14$ ions/cm$^2$, and use germanium. In this embodiment, the post amorphous region 32 in the gate 14 may have a thickness on the order of 30 nanometers. It will be understood that the energy, dose, and material may be otherwise used and varied without departing from the scope of the present invention. For example, the ion beam 36 may use arsenic, antimony, or other suitable material to form the amorphous regions 32 and 34.

Figure 1F:
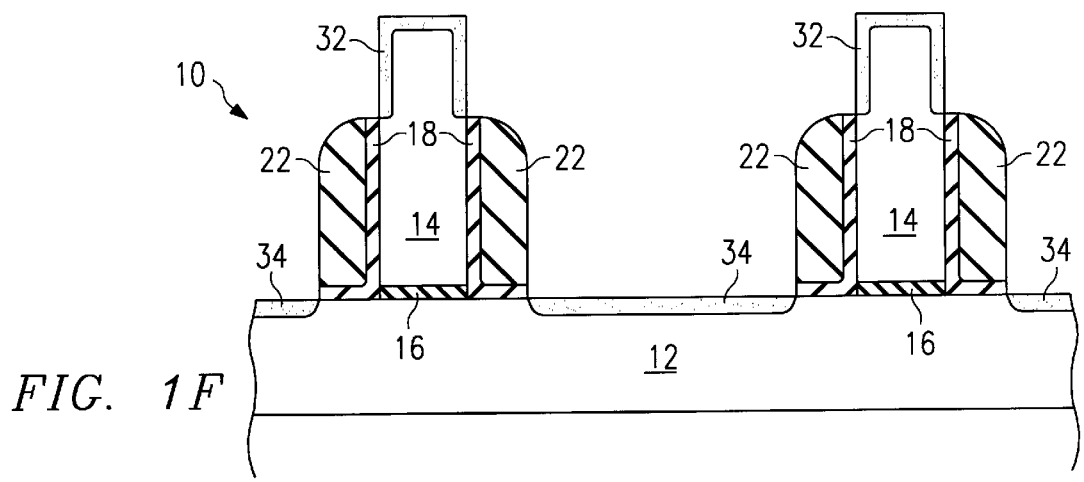
Figure 1G:
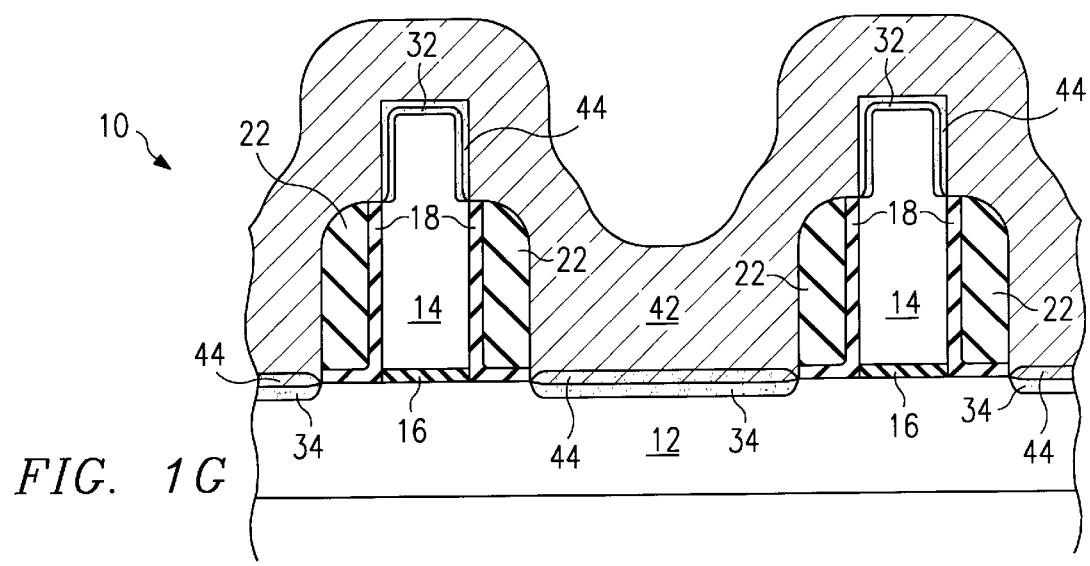

Referring to FIG. 1F, the exposed portions of the buffer layer 18 are removed. The removal process to remove the buffer layer 18 is selective to the buffer layer 18. In other words, the removal process readily removes the material comprising the exposed portions of the buffer layer 18 without substantially removing the buffer layer 18 between the spacer 22 and the gate 14 or between the spacer 22 and the substrate 12. Thus, the buffer layer 18 is removed to expose the spacer 22 and the respective amorphous layers 32 and 34. In an embodiment in which the buffer layer 18 comprises an oxide material, the exposed portion of the buffer layer 18 may be removed by a wet etch using hydrofluoric acid. It will be understood that the process to remove the exposed portions of the buffer layer 18 may include other processes without departing from the scope of the present invention.

Referring to FIG. 1O, a reactive layer 42 is formed covering the substrate 12, gate 14, and the spacer 22. The reactive layer 42 is generally deposited by Physical Vapor Deposition (PVD) such as sputtering, or by Chemical Vapor Deposition (CVD) using TiI$_4$ or TiCL$_4$ chemistry as a source gas. The thickness of the reactive layer 42 may be on the order of 5–100 nanometers. The reactive layer 42 comprises a material that will react with the amorphous regions 32 and 34 to form a silicide. In one embodiment, the reactive layer 42 comprises titanium. It will be understood that the reactive layer 42 may comprise other suitable materials for forming silicide without departing from the scope of the present invention. For example, the reactive layer 42 may comprise tungsten, tantalum, cobalt, nickel, platinum, or other suitable silicide forming materials.

According to one embodiment of the present invention, the reactive layer 42 is anisotropically etched (not shown) to remove a portion of the reactive layer 42 to thin the reactive layer 42 on the horizontal surfaces. Specifically, the reactive layer 42 proximate the top region 28 and the gap region 24 is reduced in thickness by the anisotropic etch. In an embodiment in which the reactive layer 42 is titanium, the titanium reactive layer 42 may be etched using a plasma-based Reactive Ion Etch process using a SiCl$_4$ source gas chemistry. It will be understood that the reactive layer 42 may be otherwise etched without departing from the scope of the present invention.

The reactive layer 42 is then thermally treated such that a salicidation region 44 is formed between the reactive layer 42 and the amorphous layers 32 and 34. The salicidation region 44 is formed using conventional thermal and salicidation techniques. The salicidation region 44 may be on the order of 300 Å in thickness. In an embodiment in which the reactive layer 42 is titanium, the salicidation region 44 comprises C49 titanium silicide. In this embodiment, the amorphous layers 32 and 34 allow the formation of C49 titanium silicide having a smaller grain size that results in a greater number of nucleation sites for the C49-to-C54 titanium silicide transformation. The annealing process to produce the C49-to-C54 titanium silicide transformation may be accomplished at any time during the fabrication process. The small grain size and the increased number of nucleation sites for the C49-to-C54 titanium silicide transformation reduces the sheet resistance of the titanium silicide, and accordingly, the space between electrical devices.

Figure 1H:
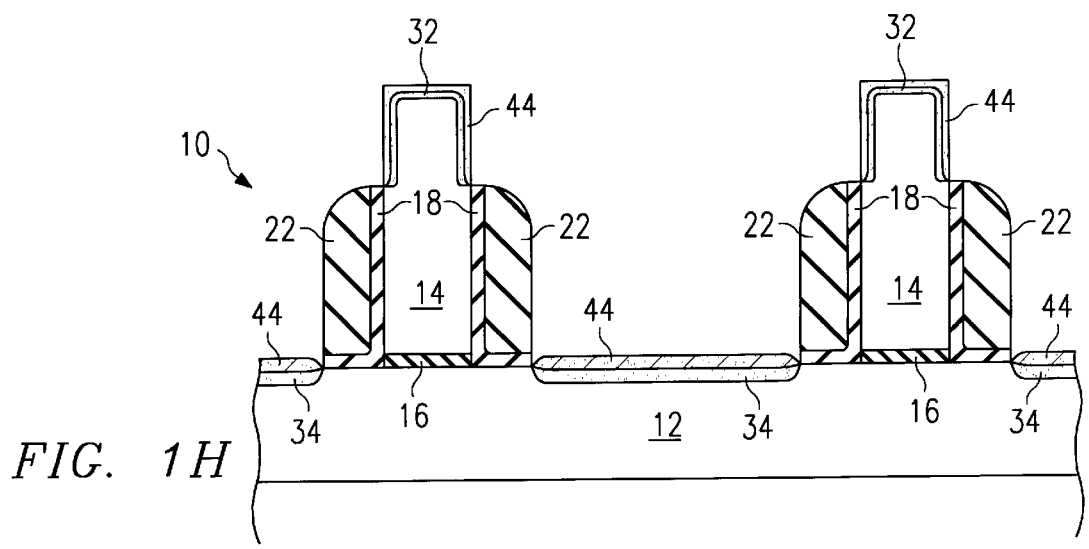

Referring to FIG. 1H, the unreacted portion of the reactive layer 42 is then removed by conventional fabrication techniques to expose the salicidation region 44. Accordingly, a high quality salicidation region 44 is formed in the post region 26 of the gate 14 while minimizing the damage in the gap region 24 of the substrate 12.

Although the present invention has been described with several embodiments, various changes and modifications may be suggested to one skilled in the art. It is intended that the present invention encompass such changes and modifications that follow within the scope of the appended claims.

What is claimed is:

1. A method of forming an amorphous region in a gate of a transistor, the method comprising:

forming the gate separated from a substrate by a gate insulator;

forming a spacer outwardly from the gate, the spacer exposing a top region and a side region of the gate; and irradiating the top region and side region of the gate using an ion beam directed at the gate at an angle to form a post amorphous region, the angle formed between the ion beam and an axis normal to a surface of the substrate and in the range of 5° to 80°.

2. The method of claim 1, and further comprising the steps of:

forming a reactive layer adjacent the post amorphous region;

forming a salicidation region between the post amorphous region and the reactive layer; and removing the unreacted portion of the reactive layer.

3. The method of claim 2, wherein the reactive layer comprises titanium.

4. The method of claim 1, and further comprising the step of forming a buffer layer covering the substrate and the gate prior to the step of forming a spacer.

5. The method of claim 4, wherein the buffer layer comprises silicon dioxide.

6. The method of claim 1, wherein the step of forming a spacer comprises the steps of:

forming a spacer layer outwardly from the substrate and the gate; and anisotropically etching the spacer layer past the top region of the gate to form the side region.

7. The method of claim 1, wherein the angle between the ion beam and the axis is approximately 45°.

8. The method of claim 1, wherein the step of irradiating the top region and side region of the gate comprises the step of irradiating the top region and side region of the gate with germanium ions using an ion beam is directed at the gate at an angle to form a post amorphous region, the angle formed between the ion beam and an axis normal to a surface of the substrate.

9. The method of claim 8, wherein the ion beam has a dose of approximately 2E14 germanium ions/cm$^2$ and an energy of approximately 40 KeV.

10. The method of claim 1, wherein the step of forming a spacer outwardly from the gate comprises the step of forming a spacer outwardly from the gate, the spacer exposing a top region and a side region of the gate, the side region approximately one-half of the width of the gate.

11. A method of forming a semiconductor component with a transistor having a salicided gate, the method of forming the salicided gate comprising the steps of:

forming a gate separated from a substrate by a gate insulator;

forming a buffer layer outwardly from the substrate and the gate;

forming a spacer layer outwardly from the buffer layer;

anisotropically etching the spacer layer to form a spacer, the spacer exposing a post region of the gate and a gap region of the substrate;

irradiating the post region and the gap region using an ion beam directed at the gate at an angle to form a post amorphous region and a gap amorphous region, respectively;

wherein the angle is formed between the ion beam and an axis normal to a surface of the substrate and operates to reduce ion implantation damage to the substrate, the angle in the range of 5° to 80°;

forming a reactive layer adjacent the post amorphous region and the gap amorphous region;

forming a salicidation region between the post amorphous region and the reactive layer by thermally treating the reactive layer, the salicidation region of the gate forming, at least in part, the salicided gate of the transistor; and removing the unreacted portion of reactive layer.

12. The method of claim 11, wherein the angle between the ion beam and the axis is approximately 45°.

13. The method of claim 11, wherein the step of irradiating the post region and the gap region comprises the step of irradiating the post region and gap region with germanium ions using an ion beam directed at the gate at an angle to form a post amorphous region and a gap amorphous region, respectively.

14. The method of claim 13, wherein the ion beam has a dose of approximately 2E14 germanium ions/cm$^2$ and an energy of approximately 40 KeV.

15. The method of claim 11, wherein the salicidation region comprises C54 titanium silicide.

16. A method of forming a salicidation region in a gate of a transistor, the method comprising:

forming the gate separated from a substrate by a gate insulator;

forming a buffer layer outwardly from the substrate and the gate;

forming a spacer layer outwardly from the buffer layer;

etching the spacer layer anisotropically to form a spacer, the spacer exposing a top region and a side region of the gate;

forming a post amorphous region in the gate by irradiating the top region and side region of the gate using an ion beam directed at the gate at an angle, the angle formed between the ion beam and an axis normal to a surface of the substrate, the angle in the range of 5° to 80°;

removing the exposed portions of the buffer layer;

forming a reactive layer adjacent the post amorphous region;

heating the reactive layer to form a salicidation region between the post amorphous region and the reactive layer; and removing the unreacted portion of the reactive layer.

17. The method of claim 16, wherein the angle between the ion beam and the axis is approximately 45°.

18. The method of claim 16, wherein the ion beam comprises a beam of germanium ions.

19. The method of claim 16, wherein the spacer comprises a silicon nitride material.

20. The method of claim 16, wherein the salicidation region comprises C54 titanium silicide.

* * * * *